United States Patent
Lai et al.

(10) Patent No.: US 10,658,345 B2
(45) Date of Patent: May 19, 2020

(54) LED DISPLAY PANEL

(71) Applicant: PlayNitride Inc., Tainan (TW)

(72) Inventors: Yu-Hung Lai, Tainan (TW); Chih-Ling Wu, Tainan (TW)

(73) Assignee: PlayNitride Inc., Tainan (TW)

(*) Notice: Subject to any disclaimer, the term of this patent is extended or adjusted under 35 U.S.C. 154(b) by 0 days.

(21) Appl. No.: 16/029,666

(22) Filed: Jul. 9, 2018

(65) Prior Publication Data
US 2019/0013298 A1 Jan. 10, 2019

(30) Foreign Application Priority Data
Jul. 10, 2017 (TW) .............................. 106122990 A

(51) Int. Cl.
H01L 33/38 (2010.01)
H01L 25/075 (2006.01)
H01L 33/62 (2010.01)
H01L 33/44 (2010.01)
H01L 33/40 (2010.01)

(52) U.S. Cl.
CPC .......... H01L 25/0753 (2013.01); H01L 33/62 (2013.01); H01L 33/387 (2013.01); H01L 33/40 (2013.01); H01L 33/44 (2013.01)

(58) Field of Classification Search
CPC ... H01L 25/0753; H01L 27/32; H01L 33/387; H01L 33/40; H01L 33/62
See application file for complete search history.

(56) References Cited

U.S. PATENT DOCUMENTS 10,121,772 B1 * 11/2018 Wu ........................ H01L 25/167

* cited by examiner

Primary Examiner — Hoai V Pham
(74) Attorney, Agent, or Firm — JCIPRNET

(57) ABSTRACT

A display panel includes a substrate, a plurality of first light emitting diodes (LEDs), a plurality of second LEDs, a plurality of first common electrodes, and a plurality of second common electrodes. Each pixel unit of the substrate includes a first sub-pixel region and a second sub-pixel region. The first LEDs are disposed on the substrate and located in the first sub-pixel regions, and the second LEDs are disposed on the substrate and located in the second sub-pixel regions. A dominant wavelength of each of the first LEDs is different from that of each of the second LEDs. The first common electrodes are connected to and form an ohmic contact with the first LEDs. The second common electrodes are connected to and form an ohmic contact with the second LEDs. A material of the first common electrodes is different from that of the second common electrodes.

16 Claims, 7 Drawing Sheets

LED DISPLAY PANEL

CROSS-REFERENCE TO RELATED APPLICATION

This application claims the priority benefit of Taiwan application serial no. 106122990, filed on Jul. 10, 2017. The entirety of the above-mentioned patent application is hereby incorporated by reference herein and made a part of this specification.

BACKGROUND OF THE INVENTION

1. Field of the Invention

The invention relates to a display apparatus. More particularly, the invention relates to a display panel.

2. Description of Related Art

In a general display panel, common electrodes and light emitting diodes are both disposed in a display area, wherein the light emitting diodes are located in each pixel area and are electrically connected to the same common electrode. The light emitting diodes emit light by voltage bias between the common electrodes and pixel electrodes. The light emitting diodes with different dominant wavelengths (e.g., the main material of a red light emitting diode is different from that of a blue light emitting diode/or a green light emitting diode) have different electrical properties, and consequently, when the light emitting diodes are connected to the same common electrode, a problem of unstable currents occurs easily in the light emitting diodes with different light color.

SUMMARY OF THE INVENTION

The invention provides a display panel which has superior display quality.

A display panel of an embodiment of the invention includes a substrate, a plurality of first light emitting diodes, a plurality of second light emitting diodes, a plurality of first common electrodes, and a plurality of second common electrodes. The substrate has a plurality of pixel units, and each of the pixel units includes a first sub-pixel region and a second sub-pixel region. The first light emitting diodes are disposed on the substrate and located in the first sub-pixel regions. The second light emitting diodes are disposed on the substrate and located in the second sub-pixel regions. A dominant wavelength of each of the first light emitting diodes is different from a dominant wavelength of each of the second light emitting diodes. The first common electrodes are connected to the first light emitting diodes and form an ohmic contact with the first light emitting diodes. The second common electrodes are connected to the second light emitting diodes and form an ohmic contact with the second light emitting diodes. Herein, a material of the first common electrodes is different from a material of the second common electrodes.

In an embodiment of the invention, the material of the first common electrodes is gold/germanium/nickel, and the material of the second common electrodes is titanium/aluminum.

In an embodiment of the invention, the display panel further includes a plurality of third light emitting diodes disposed on the substrate and located in a third sub-pixel region of each of the pixel units. The second common electrodes are further connected to the third light emitting diodes and form an ohmic contact with the third light emitting diodes.

In an embodiment of the invention, each of the first light emitting diodes is a red micro light emitting diode, each of the second light emitting diodes is a green micro light emitting diode, and each of the third light emitting diodes is a blue micro light emitting diode.

In an embodiment of the invention, the first light emitting diodes and the second light emitting diodes are alternatively arranged in a first direction. In a second direction, a first distance between the adjacent two first light emitting diodes is identical to a second distance between the adjacent two second light emitting diodes 130a. Moreover, the first direction is perpendicular to the second direction.

In an embodiment of the invention, the first common electrodes are further contacted with the second light emitting diodes, and the second common electrodes are further connected to the first light emitting diodes.

In an embodiment of the invention, each of the first common electrodes includes a plurality of first connecting portions, and the first connecting portions are connected to the first light emitting diodes. Each of the second common electrodes includes a plurality of second connecting portions, and the second connecting portions are connected to the second light emitting diodes.

In an embodiment of the invention, each of the first light emitting diodes includes a first-type semiconductor layer, an active layer, and a second-type semiconductor layer. Each of the second light emitting diodes includes a second first-type semiconductor layer, an active layer, and a second-type semiconductor layer. The first common electrodes are electrically connected to the first-type semiconductor layers of the first light emitting diodes. The second common electrodes are electrically connected to the first-type semiconductor layers of the second light emitting diodes.

In an embodiment of the invention, the display panel further includes an insulation layer disposed on the substrate and located between the first common electrodes and the substrate and between the second common electrodes and the substrate. The first common electrodes are electrically insulated from the second-type semiconductor layers and the active layers of the first light emitting diodes with the insulation layer. The second common electrodes are electrically insulated from the second type semiconductor layers and the active layers of the second light emitting diodes with the insulation layer.

In an embodiment of the invention, a thickness of the insulation layer is greater than a first vertical distance from the active layers of the first light emitting diodes to the substrate and a second vertical distance from the active layers of the second light emitting diodes to the substrate.

In an embodiment of the invention, the insulation layer cover side walls of the active layers and the second-type semiconductor layers of the first light emitting diodes, and side walls of the active layers and the second-type semiconductor layers of the second light emitting diodes.

In an embodiment of the invention, the display panel further includes a transparent conductive layer disposed on the first common electrodes and the second common electrodes and covering the first common electrodes, the second common electrodes, the first light emitting diodes, and the second light emitting diodes.

In an embodiment of the invention, two of the first light emitting diodes connected in series with each other and connected to one of the first common electrodes in each of the first sub-pixel regions. Two of the second light emitting diodes connected in series with each other and connected to one of the second common electrodes in each of the second sub-pixel regions.

In an embodiment of the invention, the first light emitting diodes and the second light emitting diodes are alternatively arranged in a first direction. In a second direction, a first distance between the adjacent two first light emitting diodes is different from a second distance between the adjacent two second light emitting diodes. Moreover, the first direction is perpendicular to the second direction.

In an embodiment of the invention, a contact area between each of the first common electrodes and each of the first light emitting diodes accounts for 5% to 15% of an area of each of the first light emitting diodes.

In an embodiment of the invention, a contact area between each of the second common electrodes and each of the second light emitting diodes accounts for 5% to 15% of an area of each of the second light emitting diodes.

To sum up, in the design of the display panel of the embodiments of the invention, the first common electrodes are connected to the first light emitting diodes and form the ohmic contact with the first light emitting diodes, and the second common electrodes are connected to the second light emitting diodes and form the ohmic contact with the second light emitting diodes. Herein, the dominant wavelength of each of the first light emitting diodes is different from the dominant wavelength of each of the second light emitting diodes. Moreover, the material of the first common electrodes is different from the material of the second common electrodes. The problem of unstable currents generated when the light emitting diodes with different dominant wavelengths are connected to the same common electrodes in the prior art is therefore effectively improved. In short, the display panel of the embodiments of the invention may have superior display quality.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
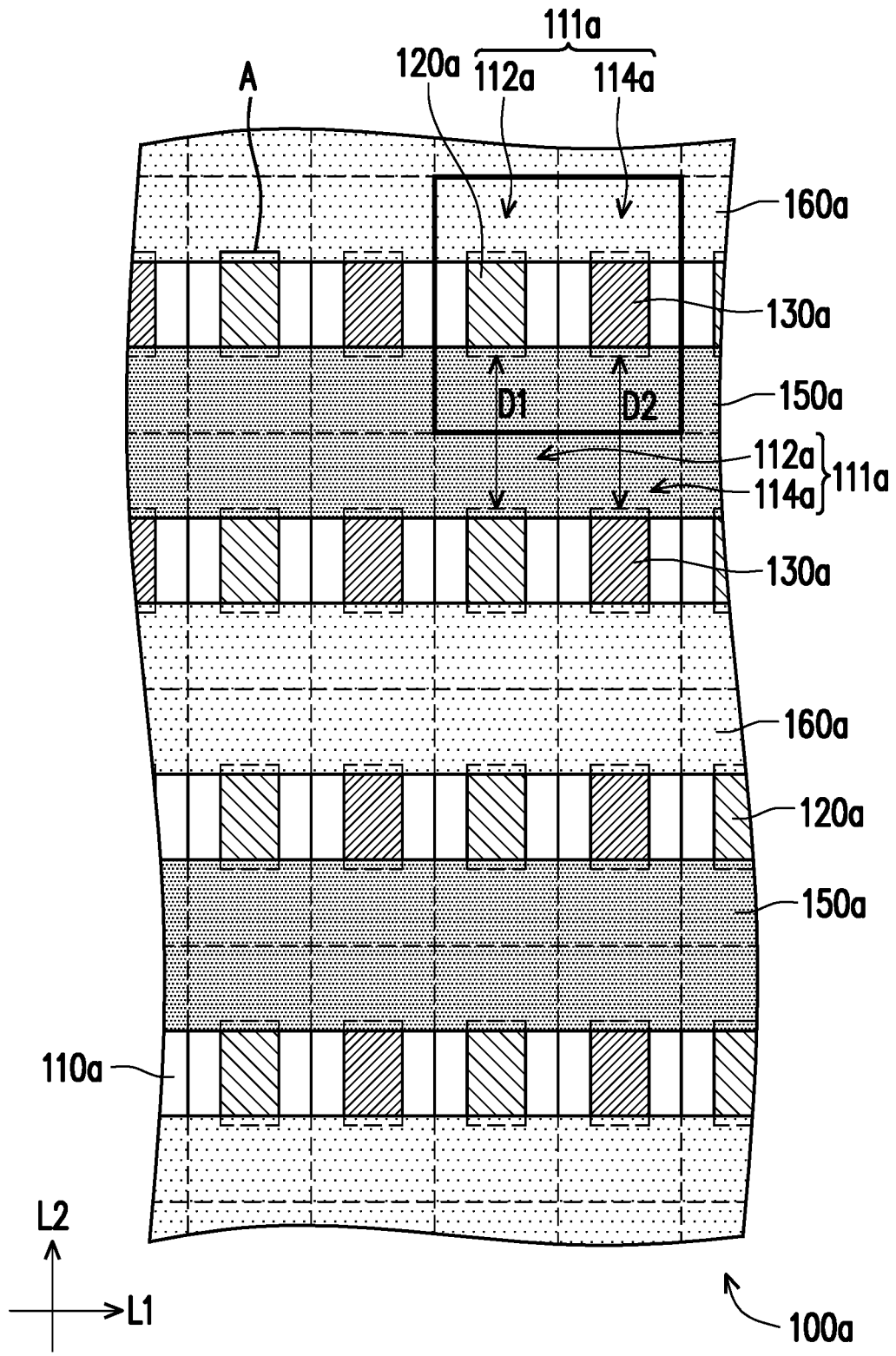
FIG. 1A illustrates a partial schematic top view of a display panel according to an embodiment of the invention.

FIG. 1A illustrates a partial schematic top view of a display panel according to an embodiment of the invention. Referring to FIG. 1A, in the present embodiment, a display panel 100a includes a substrate 110a, a plurality of first light emitting diodes 120a, a plurality of second light emitting diodes 130a, a plurality of first common electrodes 150a, and a plurality of second common electrodes 160a. The substrate 110a has a plurality of pixel units 111a, wherein each of the pixel units 111a includes a first sub-pixel region 112a and a second sub-pixel region 114a. The first light emitting diodes 120a are disposed on the substrate 110a and located in the first sub-pixel region 112a of each of the pixel units 111a. The second light emitting diodes 130a are disposed on the substrate 110a and located in the second sub-pixel region 114a of each of the pixel units 111a. A dominant wavelength of each of the first light emitting diodes 120a is different from a dominant wavelength of each of the second light emitting diodes 130a. The first common electrodes 150a are connected to the first light emitting diodes 120a and form an ohmic contact with the first light emitting diodes 120a. The second common electrodes 160a are connected to the second light emitting diodes 130a and form an ohmic contact with the second light emitting diodes 130a. Herein, a material of the first common electrodes 150a is different from a material of the second common electrodes 160a.

Specifically, the pixel units 111a of the present embodiment are arrange in an array. Herein, each of the pixel units 111a is constituted by one first sub-pixel region 112a and one second sub-pixel region 114a, and the first sub-pixel regions 112a and the second sub-pixel regions 114a are alternatively arranged in a first direction L1. The first light emitting diodes 120a are located in the first sub-pixel regions 112a. Herein, each of the first light emitting diodes 120a is, for example, a red micro light emitting diode with a dominant wavelength greater than and equal to 610 nm and less than 700 nm and with a size smaller than 100 microns (e.g. 8 microns×25 microns or 7 microns×20 microns). The second light emitting diodes 130a are located in the second sub-pixel regions 114a. Herein, each of the second light emitting diodes 130a is, for example, a micro green light emitting diode with a dominant wavelength greater than and equal to 490 nm and less than 570 nm, or a micro blue light emitting diode with a dominant wavelength greater than and equal to 430 nm and less than 490 nm. Moreover, each of the second light emitting diodes 130a is with a size smaller than 100 microns (e.g. 8 microns×25 microns or 7 microns×20 microns). As shown in FIG. 1, the first light emitting diodes 120a and the second light emitting diodes 130a are alternatively arranged in the first direction L1. In a second direction L2, a first distance D1 between the adjacent two first light emitting diodes 120a is identical to a second distance D2 between the adjacent two second light emitting diodes 130a. Herein, the first direction L1 is perpendicular to the second direction L2. That is, the first light emitting diodes 120a and the second light emitting diodes 130a are arranged at equidistant intervals regardless of in the first direction L1 or in the second direction L2.

Further, a material of the first common electrodes 150a of the present embodiment is implemented to be gold/germanium/nickel. The first common electrodes 150a are directly connected to the first light emitting diodes 120a and the second light emitting diodes 130a, wherein a width of each of the first common electrodes 150a is, for example, 10 microns to 16 microns. Particularly, the first common electrodes 150a form the ohmic contact with merely the first light emitting diodes 120a implemented as the red light emitting diodes. In other words, the first common electrodes 150a do not form the ohmic contact with the second light emitting diodes 130a, the first common electrodes 150a are merely as a metal conductive line. Similarly, a material of the second common electrodes 160a is implemented to be titanium/aluminum. The second common electrodes 160a are directly connected to the first light emitting diodes 120a and the second light emitting diodes 130a, wherein a width of each of the second common electrodes 160a is, for example, 10 microns to 16 microns. Particularly, the second common electrodes 160a form the ohmic contact with merely the second light emitting diodes 130a implemented as the micro green light emitting diodes or the micro blue light emitting diodes. In other words, the second common electrodes 160a do not form the ohmic contact with the first light emitting diodes 120a, the second common electrodes 160a are merely as a metal conductive line.

In addition, more preferably, a contact area between each of the first common electrodes 150a and each of the first light emitting diodes 120a accounts for 5% to 15% of an area of each of the first light emitting diodes 120a. For instance, a width of the contact area is 3 microns. Similarly, a contact area between each of the second common electrodes 160a and each of the second light emitting diodes 130a accounts for 5% to 15% of an area of each of the second light emitting diodes 130a. For instance, a width of the contact area is 3 microns. Herein, referring to an area A in FIG. 1A, the contact area refers to a top view area. If the contact area between the first common electrode 150a and the first light emitting diode 120a is less than 5% of the area of the first light emitting diode 120a, a higher electrical resistance occurs resulted from insufficient contact area, and consequently, display quality of the display panel 100a is affected. If the contact area between the first common electrode 150a and the first light emitting diode 120a is greater than 15% of the area of the first light emitting diode 120a, a light emitting efficiency of the first light emitting diode 120a is affected resulted from overly large contact area, and consequently, display quality of the display panel 100a is affected.

In short, in the design of the display panel 100a of the present embodiment, the first common electrodes 150a are directly connected to the first light emitting diodes 120a and form the ohmic contact with the first light emitting diodes 120a, and the second common electrodes 160a are directly connected to the second light emitting diodes 130a and form the ohmic contact with the second light emitting diodes 130a. Moreover, the material of the first common electrodes 150a is different from the material of the second common electrodes 160a. As such, compared to the prior art in which light emitting diodes with different dominant wavelengths are connected to the same common electrode, the design of the display panel 100a of the present embodiment is conducive to preventing the problem of unstable currents from occurring. In other words, the display panel 100a of the present embodiment has superior display quality.

It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

Figure 1B:
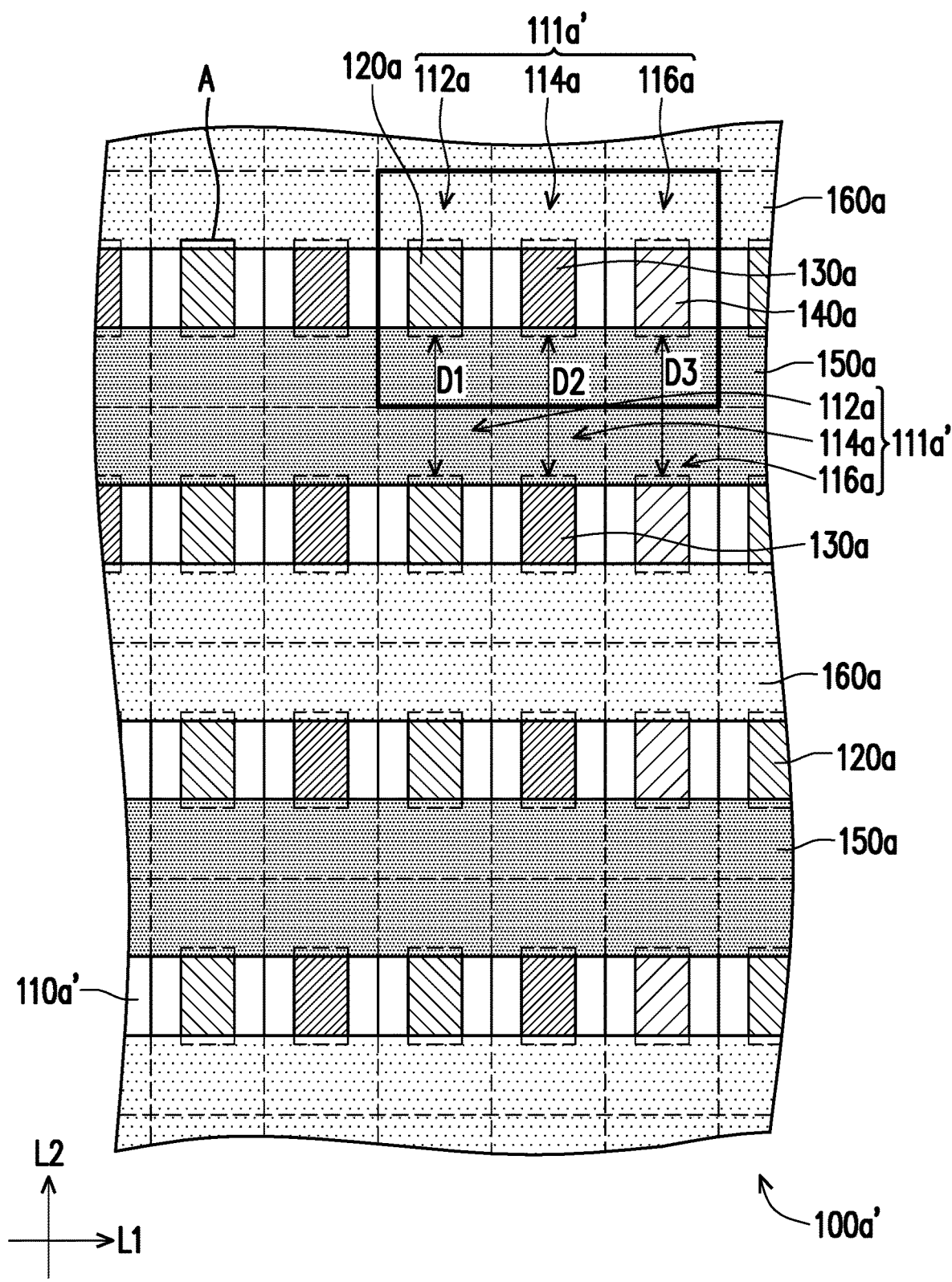
FIG. 1B illustrates a partial schematic top view of a display panel according to another embodiment of the invention.

FIG. 1B illustrates a partial schematic top view of a display panel according to another embodiment of the invention. Referring to FIG. 1A and FIG. 1B together, a display panel 100a' of the present embodiment is similar to the display panel 100a of FIG. 1A, but a difference therebetween is that the display panel 100a' of the present embodiment further includes a plurality of third light emitting diodes 140a disposed on the substrate 110a' and located in a third sub-pixel region 116a of each pixel unit 111a'. Herein, the first sub-pixel region 112a, the second sub-pixel region, 114a, and the third sub-pixel region 116a are alternatively arranged in sequence in the first direction L1. The first common electrodes 150a and the second common electrodes 160a are directly in contact with the third light emitting diodes 140a, and the second common electrodes 160a form an ohmic contact with the third light emitting diodes 140a. Herein, each of the first light emitting diodes 120a is implemented as a micro red light emitting diode, each of the second light emitting diodes 130a is implemented as a micro green light emitting diode, and each of the third light emitting diodes 140a is implemented as a micro blue light emitting diode. In the second direction L2, the first distance D1 between the adjacent two first light emitting diodes 120a, the second distance D2 between the adjacent two second light emitting diodes 130a, and a third distance D3 between the adjacent two third light emitting diodes 140a are identical.

Figure 2:
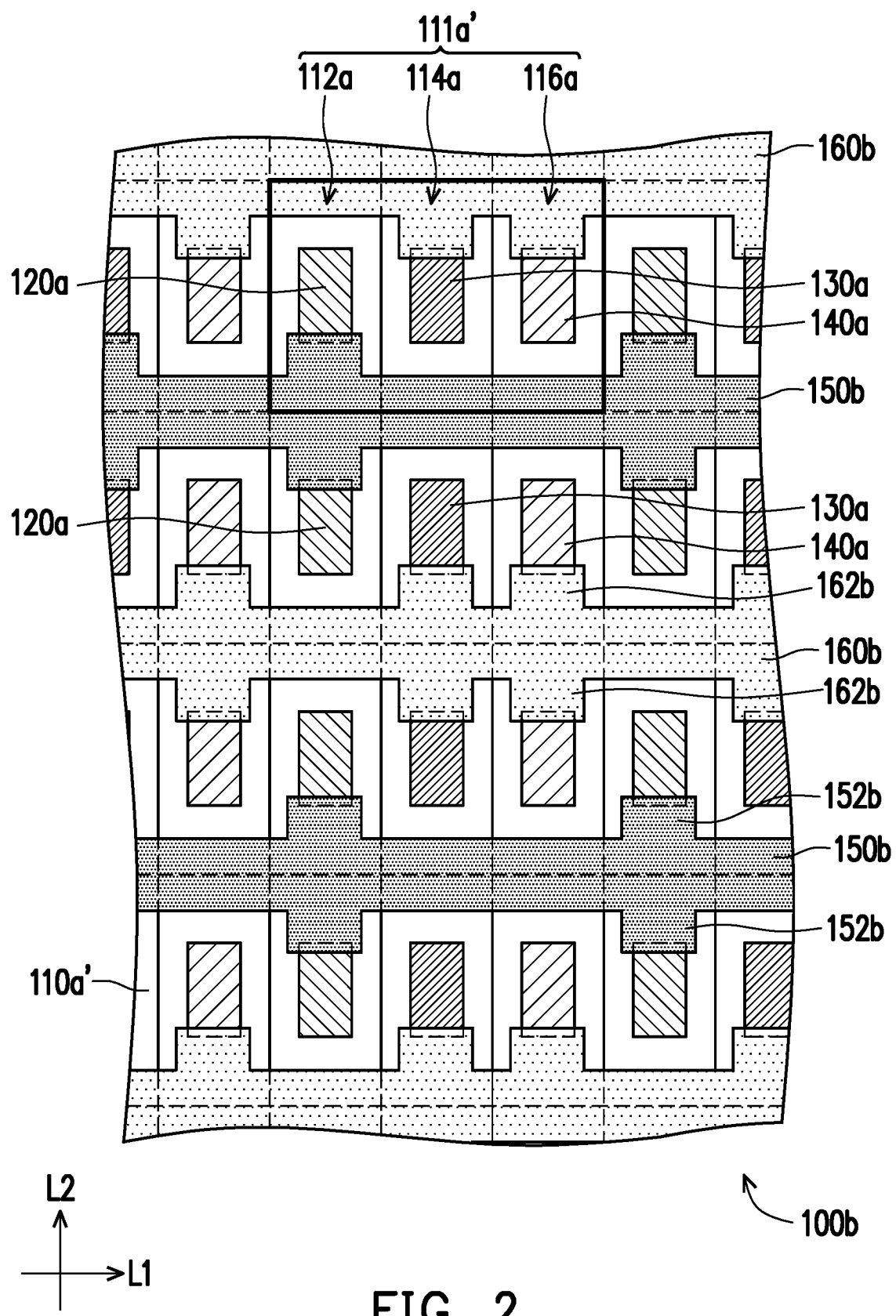
FIG. 2 illustrates a partial schematic top view of a display panel according to another embodiment of the invention.

FIG. 2 illustrates a partial schematic top view of a display panel according to another embodiment of the invention. Referring to FIG. 1B and FIG. 2 together, a display panel 100b of the present embodiment is similar to the display panel 100a' of FIG. 1B, but differences therebetween include that first electrodes 150b of the present embodiment are in contact merely with the first light emitting diodes 120a, and the second common electrodes 160b are in contact merely with the second light emitting diodes 130a and the third light emitting diodes 140a. Specifically, each of the first common electrodes 150b of the present embodiment includes a plurality of protruding first connecting portions 152b, wherein the first connecting portions 152b are connected to the first light emitting diodes 120a and are not in contact with the second light emitting diodes 130a and the third light emitting diodes 140a. Each of the second common electrodes 160b includes a plurality of protruding second connecting portions 162b, wherein the second connecting portions 162b are connected to the second light emitting diodes 130a and the third light emitting diodes 140a, and the second connecting portions 162b are not in contact with the first light emitting diodes 120a.

The first connecting portions 152b of the first common electrodes 150b are directly connected to the first light emitting diodes 120a and form an ohmic contact with the first light emitting diodes 120a, and the second connecting portions 162b of the second common electrodes 160b are directly connected to the second light emitting diodes 130a and the third light emitting diodes 140a and form ohmic contacts with the second light emitting diodes 130a and the third light emitting diodes 140a. Moreover, the material of the first common electrodes 150a is different from the material of the second common electrodes 160a. As such, in the design of the display panel 100b of the present embodiment, the problem of unstable currents in the first light emitting diodes 120a, the second light emitting diodes 130a, and the third light emitting diodes 140a are prevented from happening. Besides, the protruding design of the connecting portions may be conducive to reducing proportions of light shading and light absorbing and enhancing overall efficiency of light output. In other words, the display panel 100b of the present embodiment has superior display quality.

Figure 3A:
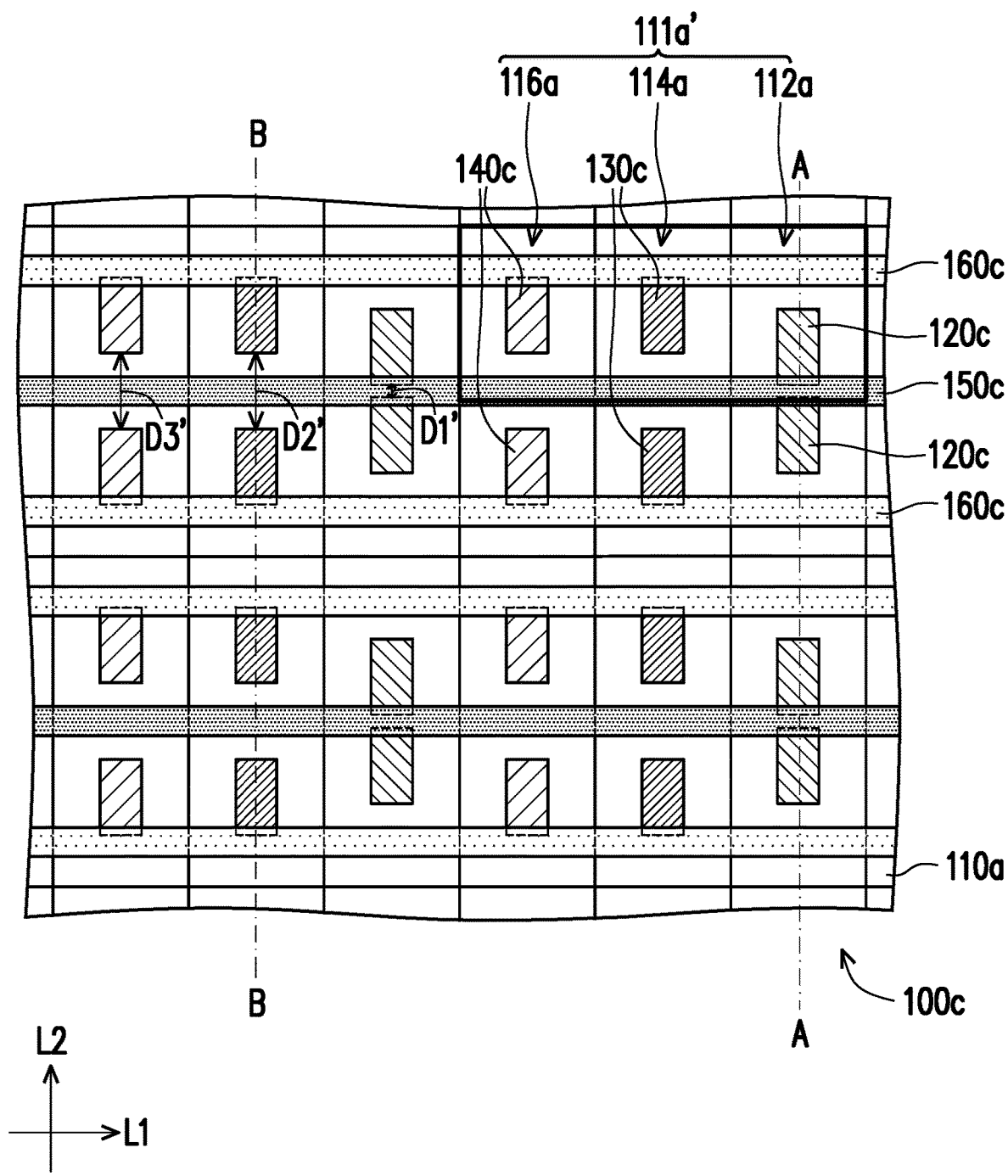
FIG. 3A illustrates a partial schematic top view of a display panel according to another embodiment of the invention.
Figure 3B:
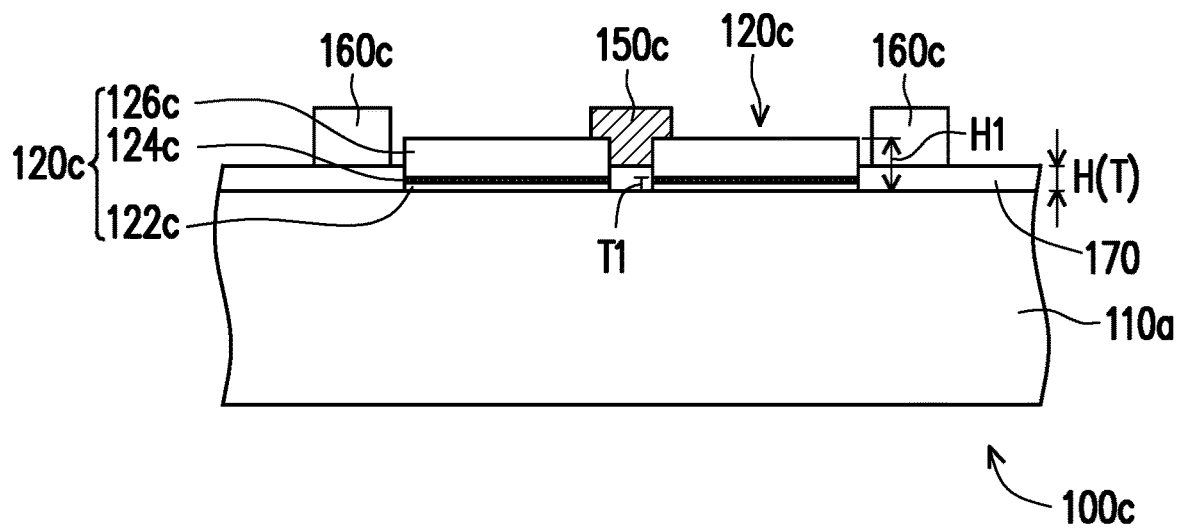
FIG. 3B illustrates a schematic cross-sectional view along a line A-A of FIG. 3A.
Figure 3C:
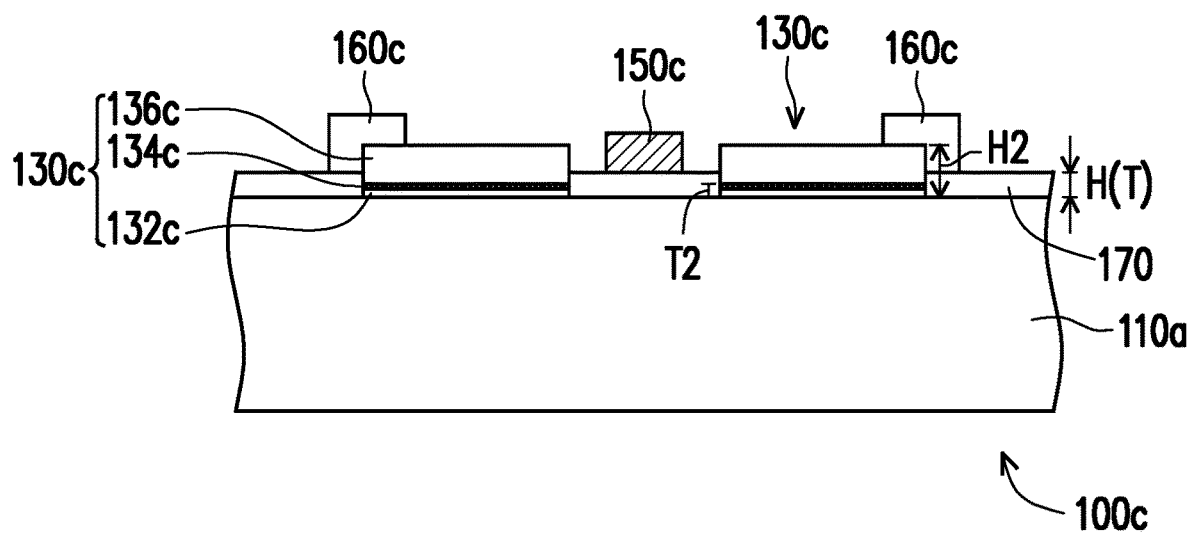
FIG. 3C illustrates a schematic cross-sectional view along a line B-B of FIG. 3A.

FIG. 3A illustrates a partial schematic top view of a display panel according to another embodiment of the invention. FIG. 3B illustrates a schematic cross-sectional view along a line A-A of FIG. 3A. FIG. 3C illustrates a schematic cross-sectional view along a line B-B of FIG. 3A. Referring to FIG. 1B and FIG. 3A to together, a display panel 100c of the present embodiment is similar to the display panel 100a' of FIG. 1B, but differences therebetween include that a first distance D1' between adjacent two first light emitting diodes 120c is different from a second distance D2' between adjacent two second light emitting diodes 130c, and the first distance D1' is different from a third distance D3' between adjacent two third light emitting diodes 140c. In details, the first light emitting diodes 120c, the second light emitting diodes 130c, and the third light emitting diodes 140c are alternatively arranged in the first direction L1. The first light emitting diodes 120c emitting identical color of lights are arranged in the second direction L2, the second light emitting diodes 130c are also arranged in the second direction L2, and the third light emitting diodes 140c are arranged in the second direction L2 as well. Since the first distance D1' is respectively different from the second distance D2' and the third distance D3', the first light emitting diodes 120c are overlapped and in contact with merely first common electrodes 150c without being overlapped and in contact with second common electrodes 160c. Similarly, the second light emitting diodes 130c and the third light emitting diodes 140c are overlapped and in contact with merely the second common electrodes 160c without being in contact with the first common electrodes 150c.

Further, referring to FIG. 3B and FIG. 3C together, to be more specifically, each of the first light emitting diodes 120c of the present embodiment includes an N-type semiconductor layer 122c, an active layer 124c, and a P-type semiconductor layer 126c. Herein, the active layer 124c is located between the N-type semiconductor layer 122c and the P-type semiconductor layer 126c, and the N-type semiconductor layer 122c is located between the active layer 124c and the substrate 110a. Each of the second light emitting diodes 130c also has substantially identical epitaxial stacking layers, as shown as FIG. 3C, an N-type semiconductor layer 132c, an active layer 134c, and a P-type semiconductor layer 136c are included. Herein, the active layer 134c is located between the N-type semiconductor layer 132c and the P-type semiconductor layer 136c, and the N-type semiconductor layer 132c is located between the active layer 134c and the substrate 110a. The first common electrodes 150c are electrically connected to the P-type semiconductor layers 126c of the first light emitting diodes 120c, and the second common electrodes 160c are electrically connected to the P-type semiconductor layers 136c of the second light emitting diodes 130c.

Further, the display panel 100c of the present embodiment also includes an insulation layer 170 disposed on the substrate 110a and located between the first common electrodes 150c and the substrate 110a and between the second common electrodes 160a and the substrate 110a. With the insulation layer 170 being disposed, the first common electrodes 150c and the N-type semiconductor layers 122c of the first light emitting diodes 120c are electrically insulated from the P-type semiconductor layers 126c and the active layers 124c, and moreover, the second common electrodes 160c are insulated from the N-type semiconductor layers 132c and the active layers 134c of the second light emitting diodes 130c. Herein, a vertical distance T from the insulation layer 170 to the substrate 110 is greater than a first vertical distance T1 from the active layer 124c to the substrate 110 and a second vertical distance T2 from the active layer 134c to the substrate 110. A thickness H of the insulation layer 170 is less than a thickness H1 of each of the first light emitting diodes 120c and a thickness H2 of each of the second light emitting diodes 130c, wherein the thickness H of the insulation layer 170 is, for example, 1 micron to 3 microns. In other words, the insulation layer 170 covers the side walls of the active layers 124c/134c, the N-type semiconductor layers 122c/132c, so as to prevent the first common electrodes 150c and the second common electrodes 160c from being in electrical contact with the active layer 124c, the active layer 134c, the N-type semiconductor layer 122c, and the N-type semiconductor layer 132c, which may lead to short circuit and malfunction of the first light emitting diodes 120c and the second light emitting diodes 130c. In addition, the third light emitting diodes 140c of the present embodiment are disposed in a manner completely identical to that in which the second light emitting diodes 130c are disposed. Thus, details thereof are not repeated hereinafter.

The first common electrodes 150c are directly connected to the first light emitting diodes 120c and form an ohmic contact with the first light emitting diodes 120c, and the second common electrodes 160c are directly connected to the second light emitting diodes 130c and the third light emitting diodes 140c and form ohmic contacts with the second light emitting diodes 130c and the third light emitting diodes 140c. Moreover, a material of the first common electrodes 150c is different from a material of the second common electrodes 160c. As such, in the design of the display panel 100c of the present embodiment, the problem of unstable currents in the first light emitting diodes 120c, the second light emitting diodes 130c, and the third light emitting diodes 140c are improved. In other words, the display panel 100a of the present embodiment has superior display quality.

Figure 4A:
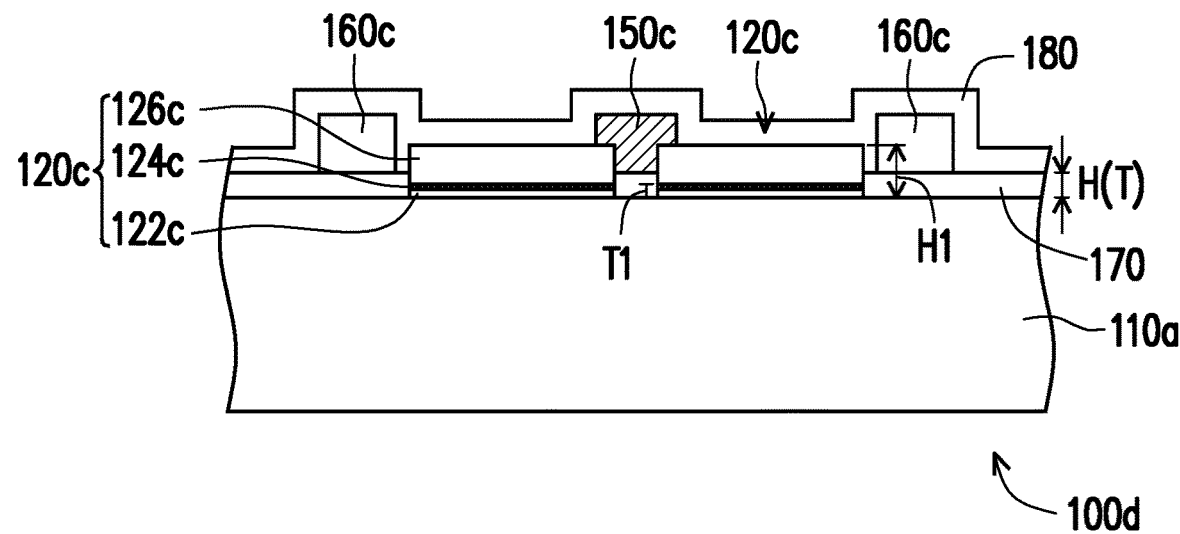
FIG. 4A and FIG. 4B respectively illustrate schematic cross-sectional views of a display panel along different section lines according to another embodiment of the invention.
Figure 4B:
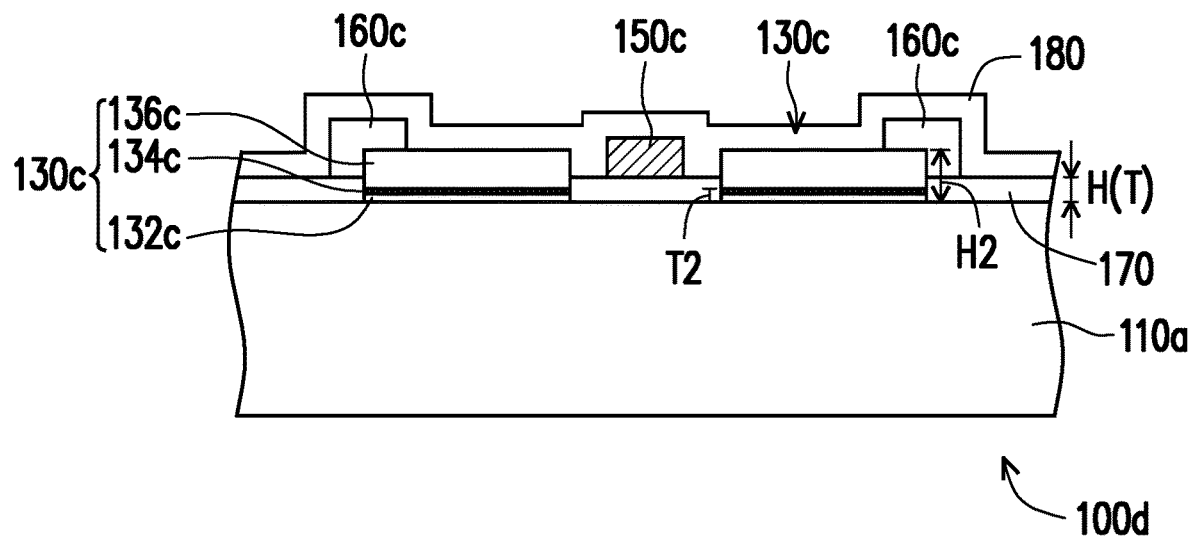

FIG. 4A and FIG. 4B respectively illustrate schematic cross-sectional views of a display panel along different section lines according to another embodiment of the invention. Referring to FIG. 3B, FIG. 3C, FIG. 4A, and FIG. 4B, a display panel 100d of the present embodiment is similar to the display panel 100c of FIG. 3B and FIG. 3C, but differences therebetween include that the display panel 100d further includes a transparent conductive layer 180 disposed on the first common electrodes 150c and the second common electrodes 160c and covering at least the first common electrodes 150c, the second common electrodes 160c, the first light emitting diodes 120c, and the second light emitting diodes 130c. Herein, the transparent conductive layer 180 is disposed to transmit currents uniformly and to protect the first common electrodes 150c, the second common electrodes 160c, the first light emitting diodes 120c, and the second light emitting diodes 130c from process damage. Moreover, the transparent conductive layer 180 could improve light extraction efficiencies of the first light emitting diodes 120c, the second light emitting diodes 130c and the third light emitting diodes 140c.

Figure 5:
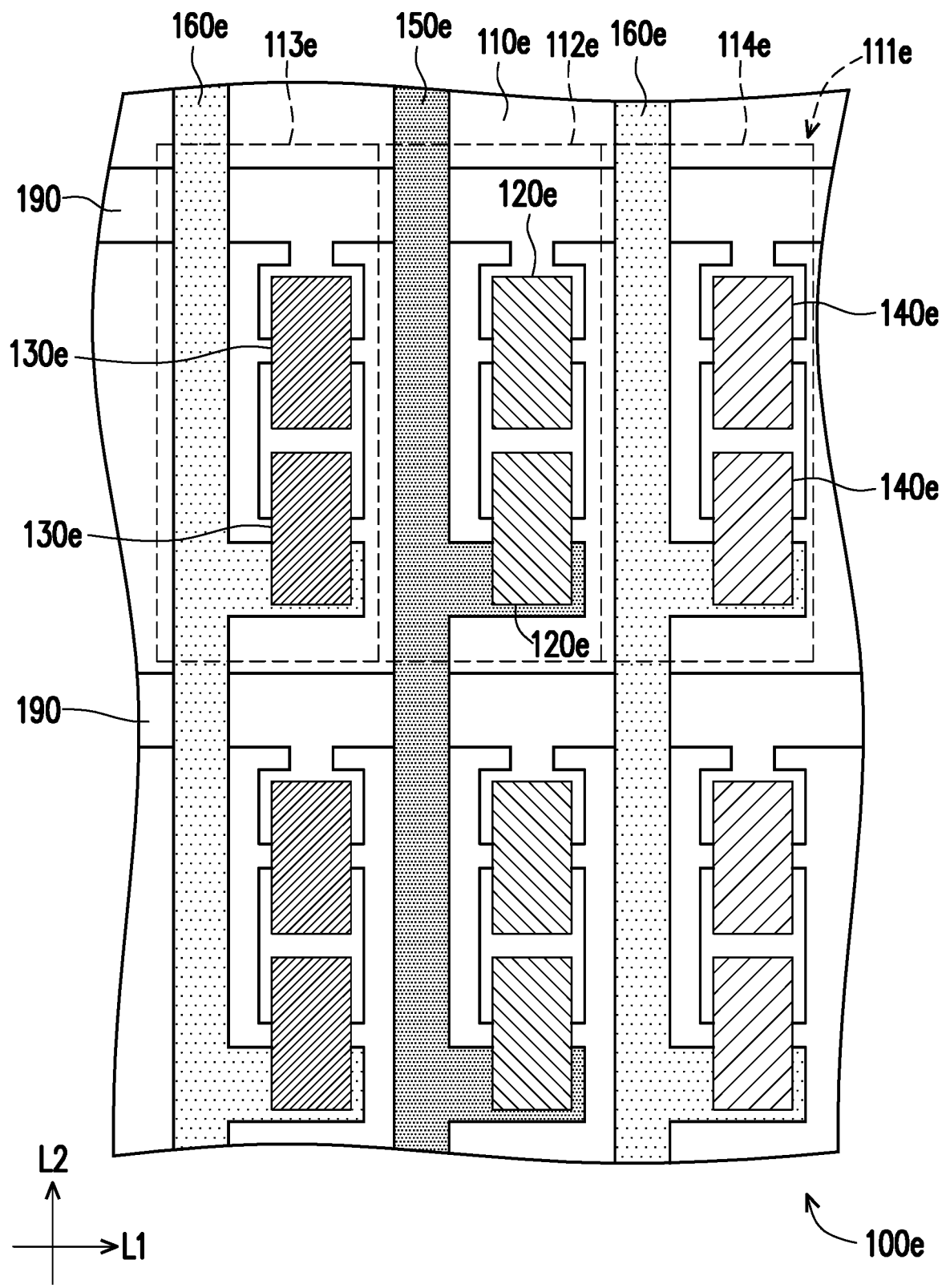
FIG. 5 illustrates a partial schematic top view of a display panel according to another embodiment of the invention.

FIG. 5 illustrates a partial schematic top view of a display panel according to another embodiment of the invention. Referring to FIG. 5, in the present embodiment, a display panel 100e includes a substrate 110e, a plurality of first light emitting diodes 120e, a plurality of second light emitting diodes 130e, a plurality of third light emitting diodes 140e, a plurality of first common electrodes 150e, and a plurality of second common electrodes 160e. The substrate 110e has a plurality of pixel units 111e, wherein each of the pixel units 111e includes a first sub-pixel region 112e, a second sub-pixel region 113e and a third sub-pixel region 114e. The first light emitting diodes 120e are disposed on the substrate 110e and located in the first sub-pixel region 112e of each of the pixel units 111e. The second light emitting diodes 130e are disposed on the substrate 110e and located in the second sub-pixel region 113e of each of the pixel units 111e. The third light emitting diodes 140e are disposed on the substrate 110e and located in the third sub-pixel region 114e of each of the pixel units 111e. The first light emitting diodes 120e, second light emitting diodes 130e and third light emitting diodes 140e are, for example, respectively red micro light emitting diodes, green micro light emitting diodes and blue micro light emitting diodes. Furthermore, a size of each micro light emitting diode is smaller than 100 microns.

The display panel 100e further includes a plurality of pixel electrodes 190. Specifically, there are two first light emitting diodes 120e connected to each other in series in each of the first sub-pixel regions 112e, and one of the two first light emitting diodes 120e forms an ohmic contact with one of the first common electrodes 150e and another one of the two first light emitting diodes 120e connects to one of the pixel electrodes 190. There are two second light emitting diodes 130e connected to each other in series in each of the second sub-pixel regions 113e, and one of the two second light emitting diodes 130e forms an ohmic contact with one of the second common electrodes 160e and another one of the two second light emitting diodes 130e connects to one of the pixel electrodes 190. There are two third light emitting diodes 140e connected to each other in series in each of the third sub-pixel regions 114e, and one of the two third light emitting diodes 140e forms an ohmic contact with one of the first common electrodes 160e and another one of the two third light emitting diodes 140e connects to one of the pixel electrodes 190.

Herein, a material of the first common electrodes 150a is different from a material of the second common electrodes 160e. Further, a material of the first common electrodes 150e of the present embodiment is implemented to be gold/germanium/nickel. a material of the second common electrodes 160e is implemented to be titanium/aluminum.

In view of the foregoing, in the design of the display panel of the embodiments of the invention, the first common electrodes are connected to the first light emitting diodes and form the ohmic contact with the first light emitting diodes, and the second common electrodes are connected to the second light emitting diodes and form the ohmic contact with the second light emitting diodes. Herein, the dominant wavelength of each of the first light emitting diodes is different from the dominant wavelength of each of the second light emitting diodes. Moreover, the material of the first common electrodes is different from the material of the second common electrodes. The problem of unstable currents generated when the light emitting diodes with different dominant wavelengths are connected to the same common electrodes in the prior art is therefore effectively solved. In short, the display panel of the embodiments of the invention may have superior display quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display panel, comprising:
a substrate having a plurality of pixel units, each of the pixel units comprising a first sub-pixel region and a second sub-pixel region;
a plurality of first light emitting diodes disposed on the substrate and located in the first sub-pixel regions;
a plurality of second light emitting diodes disposed on the substrate and located in the second sub-pixel regions, wherein a dominant wavelength of each of the first light emitting diodes is different from a dominant wavelength of each of the second light emitting diodes;
a plurality of first common electrodes connected to the first light emitting diodes and forming an ohmic contact with the first light emitting diodes; and
a plurality of second common electrodes connected to the second light emitting diodes and forming an ohmic contact with the second light emitting diodes, wherein a material of the first common electrodes is different from a material of the second common electrodes.

2. The display panel as claimed in claim 1, wherein the material of the first common electrodes is gold/germanium/nickel, and the material of the second common electrodes is titanium/aluminum.

3. The display panel as claimed in claim 1, further comprising:
a plurality of third light emitting diodes disposed on the substrate and located in a third sub-pixel region of each of the pixel units, wherein the second common electrodes are further connected to the third light emitting diodes and form an ohmic contact with the third light emitting diodes.

4. The display panel as claimed in claim 3, wherein each of the first light emitting diodes is a red micro light emitting diode, each of the second light emitting diodes is a green micro light emitting diode, and each of the third light emitting diodes is a blue micro light emitting diode.

5. The display panel as claimed in claim 1, wherein the first light emitting diodes and the second light emitting diodes are alternatively arranged in a first direction, a first distance between the adjacent two first light emitting diodes is identical to a second distance between the adjacent two second light emitting diodes in a second direction, and the first direction is perpendicular to the second direction.

6. The display panel as claimed in claim 5, wherein the first common electrodes are further contacted with the second light emitting diodes, and the second common electrodes are further contacted with the first light emitting diodes.

7. The display panel as claimed in claim 5, wherein each of the first common electrodes comprises a plurality of first connecting portions, the first connecting portions are connected to the first light emitting diodes, each of the second common electrodes comprises a plurality of second connecting portions, and the second connecting portions are connected to the second light emitting diodes.

8. The display panel as claimed in claim 1, wherein each of the first light emitting diodes comprises a first-type semiconductor layer, an active layer, and a second-type semiconductor layer, each of the second light emitting diodes comprises a first-type semiconductor layer, an active layer, and a second-type semiconductor layer, the first common electrodes are electrically connected to the first-type semiconductor layers of the first light emitting diodes, and the second common electrodes are electrically connected to the first-type semiconductor layers of the second light emitting diodes.

9. The display panel as claimed in claim 8, further comprising:

an insulation layer disposed on the substrate and located between the first common electrodes and the substrate and between the second common electrodes and the substrate, the first common electrodes being electrically insulated from the second-type semiconductor layers and the active layers of the first light emitting diodes with the insulation layer, the second common electrodes thus being electrically insulated from the second-type semiconductor layers and the active layers of the second light emitting diodes with the insulation layer.

10. The display panel as claimed in claim 9, wherein a thickness of the insulation layer is greater than a first vertical distance from the active layers of the first light emitting diodes to the substrate and a second vertical distance from the active layers of the second light emitting diodes to the substrate.

11. The display panel as claimed in claim 9, wherein the insulation layer cover side walls of the active layers and the second-type semiconductor layers of the first light emitting diodes, and side walls of the active layers and the second-type semiconductor layers of the second light emitting diodes.

12. The display panel as claimed in claim 1, further comprising:

a transparent conductive layer disposed on the first common electrodes and the second common electrodes and covering the first common electrodes, the second common electrodes, the first light emitting diodes, and the second light emitting diodes.

13. The display panel as claimed in claim 1, wherein two of the first light emitting diodes connected in series with each other and connected to one of the first common electrodes in each of the first sub-pixel regions, and two of the second light emitting diodes connected in series with each other and connected to one of the second common electrodes in each of the second sub-pixel regions.

14. The display panel as claimed in claim 1, wherein the first light emitting diodes and the second light emitting diodes are alternatively arranged in a first direction, a first distance between the adjacent two first light emitting diodes is different from a second distance between the adjacent two second light emitting diodes in a second direction, and the first direction is perpendicular to the second direction.

15. The display panel as claimed in claim 1, wherein a contact area between each of the first common electrodes and each of the first light emitting diodes accounts for 5% to 15% of an area of each of the first light emitting diodes.

16. The display panel as claimed in claim 1, wherein a contact area between each of the second common electrodes and each of the second light emitting diodes accounts for 5% to 15% of an area of each of the second light emitting diodes.

* * * * *